United States Patent
Hong

[19]

[11] Patent Number: 5,952,039
[45] Date of Patent: Sep. 14, 1999

[54] METHOD FOR MANUFACTURING DRAM CAPACITOR

[75] Inventor: Gary Hong, Hsinchu, Taiwan

[73] Assignee: United Microelectronics Corp., Taiwan

[21] Appl. No.: 09/009,332

[22] Filed: Jan. 20, 1998

[30]   Foreign Application Priority Data

Nov. 4, 1997 [TW] Taiwan ................................. 86116972

[51] Int. Cl.$^6$ ........................ B05D 5/12; H01L 21/8242
[52] U.S. Cl. ........................ 427/79; 438/255; 438/398
[58] Field of Search ........................ 438/238, 239, 438/253, 254, 255, 396, 397, 398; 427/79, 282, 402

[56]   References Cited

U.S. PATENT DOCUMENTS

| | | | |
|---|---|---|---|
| 5,429,980 | 7/1995 | Yang et al. | 437/52 |
| 5,447,878 | 9/1995 | Park et al. | 437/52 |
| 5,650,351 | 7/1997 | Wu | 437/52 |
| 5,656,532 | 8/1997 | Tseng | 438/253 |
| 5,728,617 | 3/1998 | Tseng | 438/253 |

*Primary Examiner*—Brian K. Talbot
*Attorney, Agent, or Firm*—Rabin & Champagne P.C.

[57]   ABSTRACT

A method for manufacturing DRAM capacitor that utilizes a self-aligned operation to form a forked-shaped capacitor structure having dual trenches or a multiple of trenches. No additional masking steps are required, and the uneven surface produced by the method of this invention is able to increase the surface area of the lower electrode. Hence, a high capacitance for the DRAM capacitor is obtained and a high level integration of DRAM cells can be realized.

16 Claims, 4 Drawing Sheets

5,952,039

METHOD FOR MANUFACTURING DRAM CAPACITOR

CROSS-REFERENCE TO RELATED APPLICATION

This application claims the priority benefit of Taiwan application Ser. No. 86116972, filed Nov., 14, 1997, the full disclosure of which is incorporated herein by reference.

BACKGROUND OF THE INVENTION

1. Field of Invention

The present invention relates to a method for manufacturing a capacitor for a semiconductor device. More particularly, the present invention relates to the manufacturing of a capacitor for a dynamic random access memory (DRAM) cell.

2. Description of Related Art

DRAMs use an array of capacitors fabricated on a semiconductor substrate to store digital data. In general, the charge storage states are utilized to store a bit of data. Normally, a capacitor with charges is regarded as in a logic "1" state, and a capacitor without stored charges is regarded as in a logic "0" state. Hence, a single bit of binary data is stored in a capacitor. The charge storage capacity of a capacitor depends on several factors including surface area within the electrode of a capacitor, the reliability of the electrode isolation and the dielectric constant of the dielectric layer between the electrodes of a capacitor. Storage and retrieval of data to and from memory as well as reading and writing operations are executed by the transfer of charges to or from the capacitor through a transfer field effect transistor (FET), which is coupled to a bit line. The bit line is connected to one source/drain terminal of the transfer FET, while the charge storage capacitor is connected to the other source/drain terminal of the transfer FET. A word line is connected to the gate of the transfer FET. Control signals can then be sent through the word line to the gate of the transfer FET, thereby switching open the transistor. Hence, an electrical connection between one electrode of the capacitor and the bit line is established, and the transfer of charges to and from the capacitor is allowed.

To increase data storage capacity of memory in a single chip, one method is to increase its density. High-density memory not only can provide a compact structural design on a wafer, but can also save production cost. In general, the density of an integrated circuit device can be increased by reducing the wiring lines, the dimensions of a transistor gate or area occupation of a device isolation region. However, the reduction in dimensions for some circuit elements is always limited by some newly established set of design rules because of miniaturization.

FIG. 1 is an equivalent circuit diagram of a DRAM unit. A DRAM unit comprises a transfer transistor T and a storage capacitor C. The source terminal of a transfer transistor T is connected to a bit line BL, and the drain terminal is connected to a storage electrode of a storage capacitor C. The gate terminal of the transfer transistor is connected to a word line WL. The opposed electrode 12 is connected to a fixed voltage source. A dielectric layer 14 is formed between the storage electrode 10 and the opposed electrode 12.

In order to increase the surface area of the lower electrode of a capacitor, various methods of fabricating uneven surface structures are invented including, for example, crown-shaped, pillar-shaped, fin-shaped, a tree-trunk with branches or a cavity structure. In addition, a hemispherical grained silicon (HSG-Si) layer can be formed over the surface of an electrode to increase the charge storage capacity of a capacitor up to about 80 percent. However, the capacitance of a capacitor can still be increased by following an improved method of manufacturing.

SUMMARY OF THE INVENTION

Accordingly, the present invention is directed to provide a self-aligned processing method for forming a fork-shaped capacitor structure having either a dual or a plurality of trenches. Furthermore, no additional mask making operation is required for forming an uneven lower electrode surface. Due to the unevenness of the lower electrode surface, capacitance of the capacitor can be further increased and a higher density for DRAM cells can be provided.

To achieve these and other advantages and in accordance with the purpose of the invention, as embodied and broadly described herein, the invention provides a method for manufacturing DRAM capacitor. First, a semiconductor substrate is provided. Above the substrate, there is a MOS transistor. One source/drain terminal of the MOS transistor is electrically coupled to a bit line. The method of manufacturing a DRAM capacitor comprises the steps of sequentially forming an insulating layer and a silicon nitride layer over the substrate, then patterning the silicon nitride layer and the insulating layer. Next, a via is formed that leads to the bit line. Thereafter, a first polysilicon layer and a first oxide layer is sequentially formed above the silicon nitride layer, wherein the first polysilicon layer also completely fills the via. Next, the first oxide layer is patterned. Afterwards, silicon nitride spacers are formed on the sidewalls of the patterned first oxide layer covering a portion of the first polysilicon layer. Subsequently, a second oxide layer is formed over the exposed first polysilicon layer, and then the silicon nitride spacers are removed. Next, using the first oxide layer and the second oxide layer as masks, the first polysilicon layer is etched to form two trenches in the first polysilicon layer. Thereafter, the first oxide layer and the second oxide layer are removed, and then the first polysilicon layer is patterned to form a dual trench structure.

After that, the silicon nitride layer is removed to expose the insulating layer. Finally, a hemispherical grained silicon layer is formed over the insulating layer and the dual trench structure, and then the hemispherical grained silicon layer is patterned using the dual trench structure as a mask. After the patterning of the hemispherical grained silicon layer, the remaining hemispherical grained silicon layer together with the dual trench structure constitutes a lower electrode of the capacitor. Lastly, a dielectric layer and a second polysilicon layer are sequentially formed over the lower electrode, wherein the second polysilicon layer acts as an upper electrode of the DRAM capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
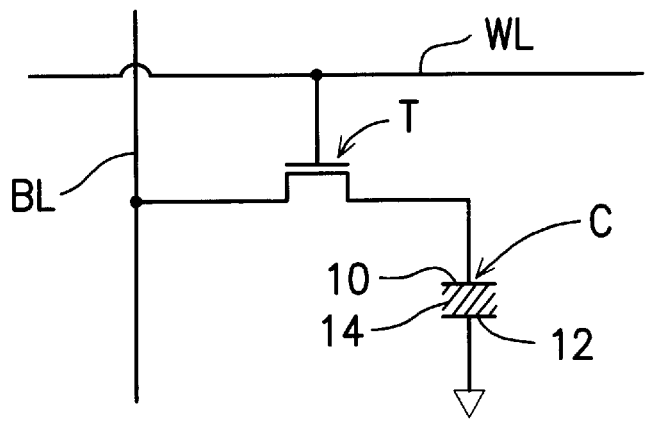
FIG. 1 is an equivalent circuit diagram of a DRAM unit.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are cross-sectional views showing the progression of manufacturing steps in producing a DRAM capacitor according to one preferred embodiment of this invention.

Figure 2A:
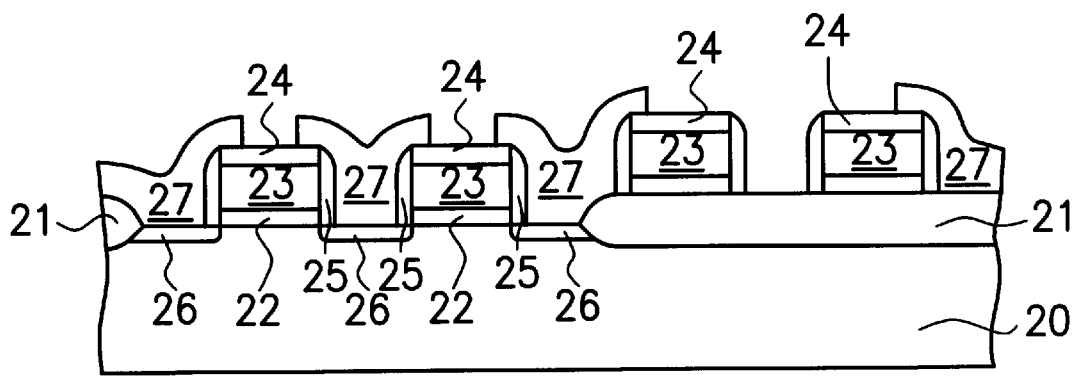
FIGS. 2A through 2H are cross-sectional views showing the progression of manufacturing steps in producing a DRAM capacitor according to one preferred embodiment of this invention.

First, as shown in FIG. 2A, a device isolation structure 21 is formed on a silicon substrate 20. The device isolation structure 21 can be, for example, a LOCOS structure preferably having an oxide thickness of about 3000 Å formed by a thermal oxidation method. The device isolation structure 21 can also be a shallow trench isolation formed by etching a shallow trench followed by an oxide deposition. Next, a gate oxide layer 22 is formed over the substrate 20 using a thermal oxidation method. Thereafter, a low pressure chemical vapor deposition (LPCVD) method is used, for example, to form a layer of polysilicon over the gate oxide layer 22.

Then, impurities are doped to increase the electrical conductivity of the polysilicon layer. Finally, the polysilicon layer is patterned to form gate terminals 23 (functioning as word lines). Afterwards, an oxide layer 24 is formed over the polysilicon gate layers 23 for protecting the polysilicon gate layers 23 or acting as an etching stop layer in subsequent processing operations. Next, oxide spacers 25 are formed on the sidewalls of the polysilicon gate layers 23, and then ions are implanted into the substrate 20 to form source/drain regions 26. During the ion implantation, the ions are aligned properly into specified regions in the substrate 20 due to the channeling action of the oxide spacers 25. Subsequently, a low pressure chemical vapor deposition (LPCVD) method is again used to form a layer of polysilicon. Then, conventional technique is used to pattern the polysilicon layer to form a bit line 27, which is electrically couples with a source/drain region 26.

Figure 2B:
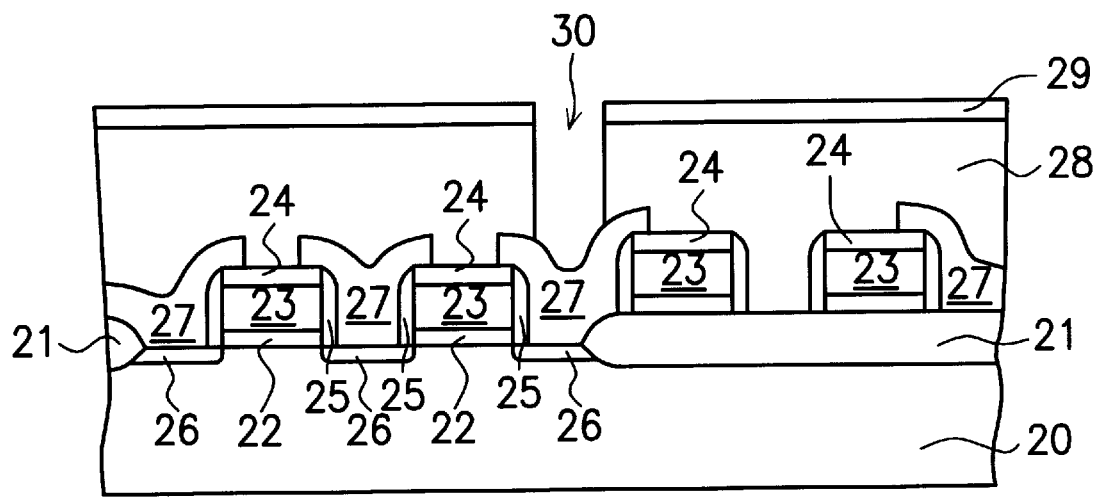

Next, as shown in FIG. 2B, a chemical vapor deposition (CVD) method is used to deposit a planarized insulating layer 28 over the word lines 23 and the bit lines 27. For example, an atmospheric pressure chemical vapor deposition (APCVD) or a plasma-enhanced chemical vapor deposition (PECVD) method is used to deposit a borophosphosilicate glass (BPSG) layer. This is followed by a heat-reflow or a chemical-mechanical polishing (CMP) operation in order to planarize the BPSG layer. Planarization of the BPSG layer serves to increase the ease of deposition as well as the quality of the deposition in subsequent processes. Thereafter, a silicon nitride layer 29 is deposited over the insulating layer 28. Next, a conventional photolithographic process is used to form a photomask, and then the silicon nitride layer 29 and the insulating layer 28 are then etched to form a via 30.

Figure 2C:
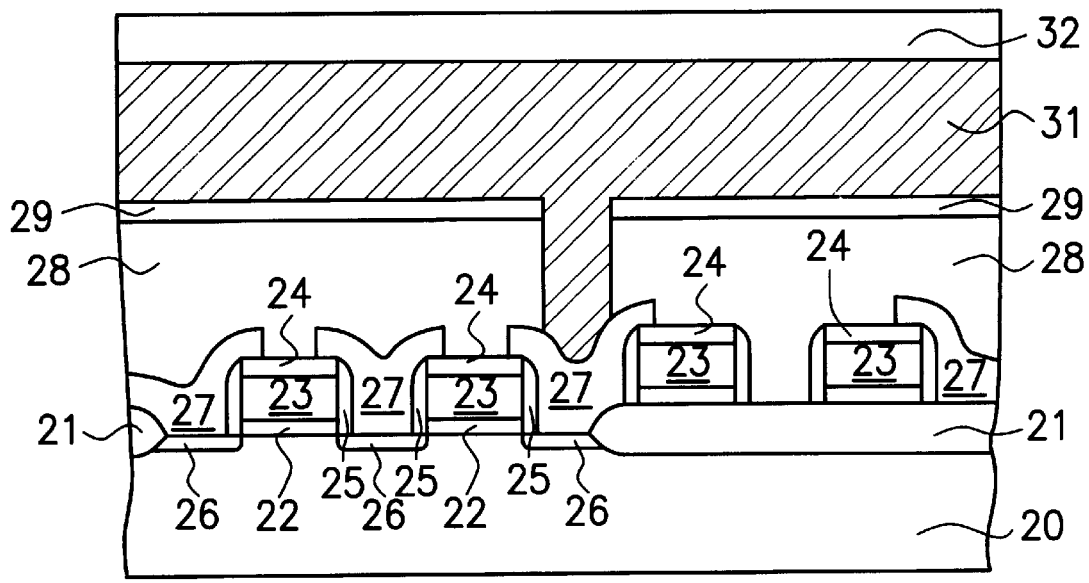

Next, as shown in FIG. 2C, a first polysilicon layer 31 is deposited over the silicon nitride layer 29. The first polysilicon layer 31 not only fills the via 30 completely, but also extends to cover the silicon nitride layer 29. Subsequently, a first oxide layer 32 is formed over the first polysilicon layer 31, wherein the first polysilicon layer 31 preferably having a thickness of between 1000 Å to 10000 Å and impurities-doped to increase its electrical conductivity.

Figure 2D:
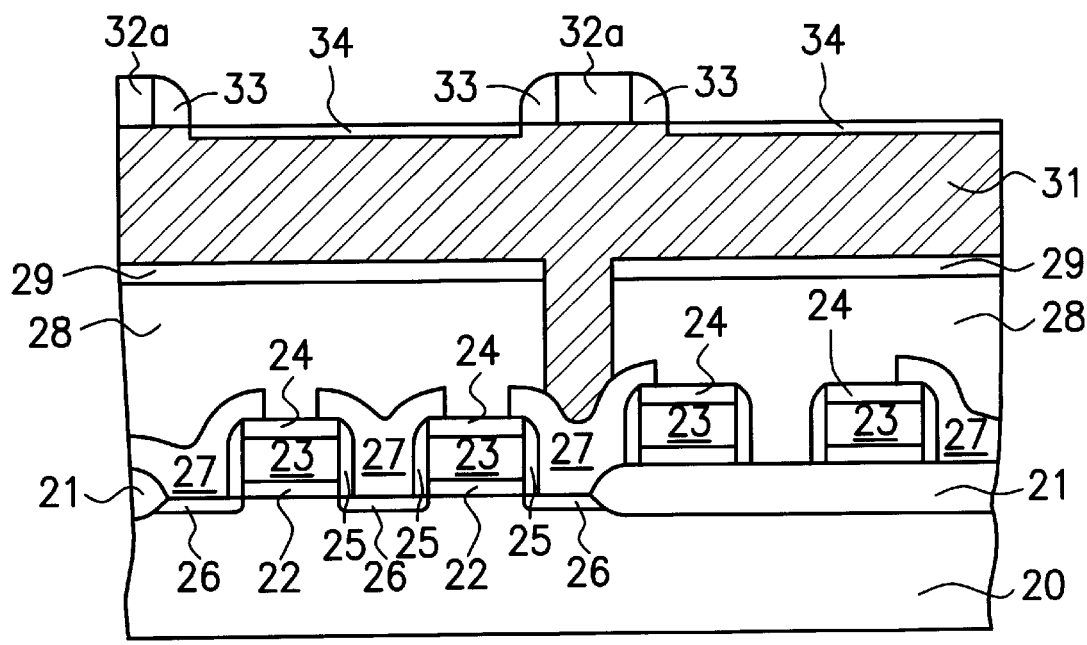

Next, as shown in FIG. 2D, photolithographic and dry etching processes are used to pattern the first oxide layer 32. Eventually, only a residual portion of the first oxide layer 32a remains while a portion of the first polysilicon layer is exposed. Thereafter, a silicon nitride layer is deposited over the patterned first oxide layer 32a. Then, the silicon nitride layer is etched back using a dry etching method to re-expose the first polysilicon layer 31 and forming silicon nitride spacers 33 on the sidewalls of the first oxide layer 32a. Next, a second oxide layer 34 preferably having a thickness of about 200 Å to 1000 Å is formed over the exposed first polysilicon layer 31 using, for example, a thermal oxidation method. In the above process, the first polysilicon layer 31 is now changed to a polysilicon layer 31a.

Figure 2E:
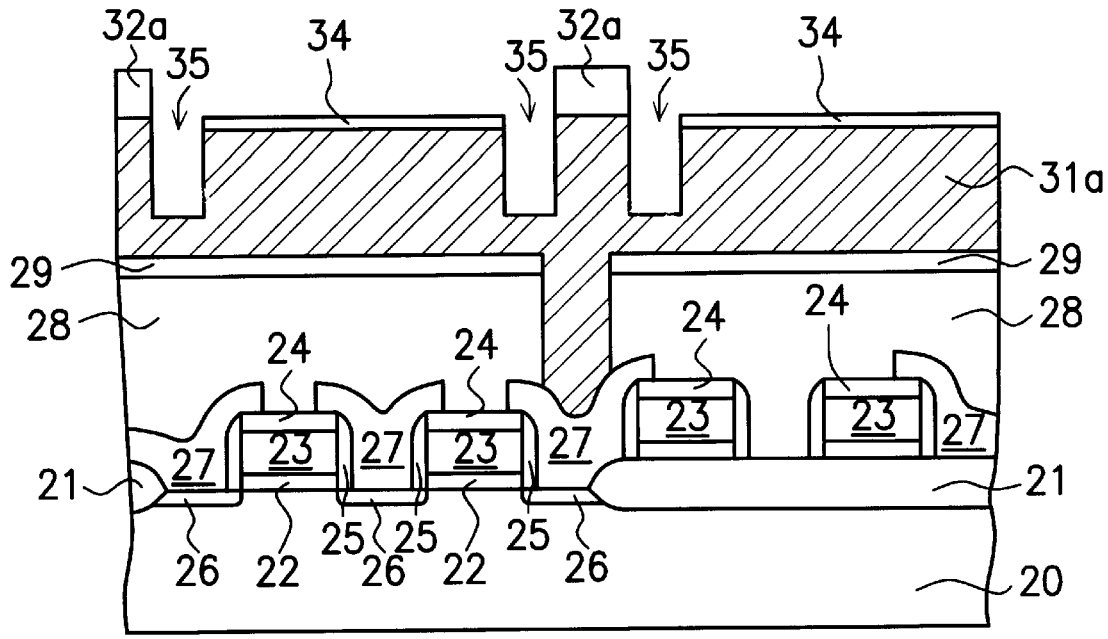

Next, as shown in FIG. 2E, the silicon nitride spacers 33 are removed to expose a portion of the first polysilicon layer 31. Then, using the first oxide layer 32a and the second oxide layer 34 as masks, the exposed first polysilicon layer 31 is etched using, for example, a self-aligned dry etching method. Finally, two trenches are formed in the first polysilicon layer 31a.

Figure 2F:
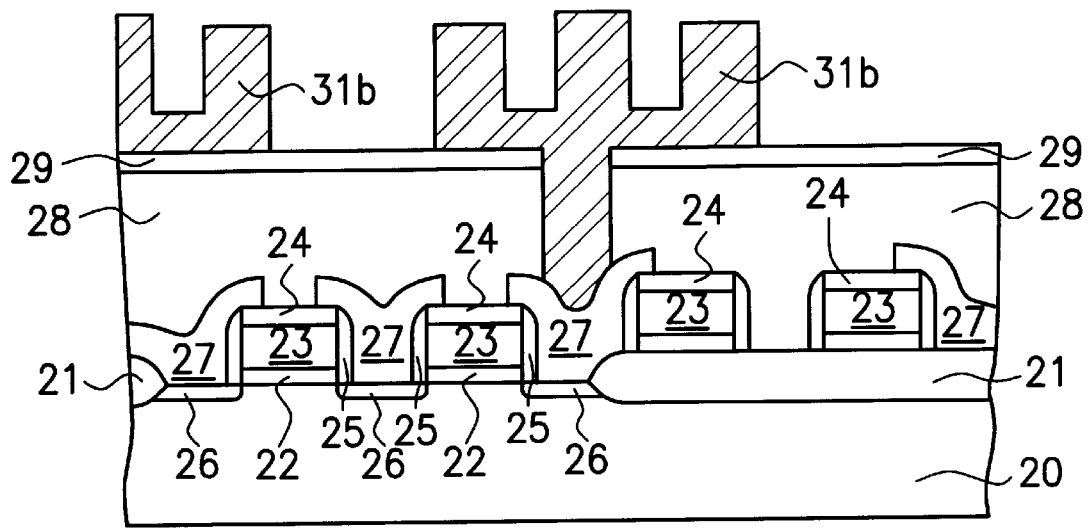

Thereafter, as shown in FIG. 2F, the first oxide layer 32a and the second oxide layer 34 above the first polysilicon layer 31a are removed. Then, the first polysilicon layer 31a is patterned to form a dual trench structure 31b acting as the main body of the capacitor's lower electrode.

Figure 2G:
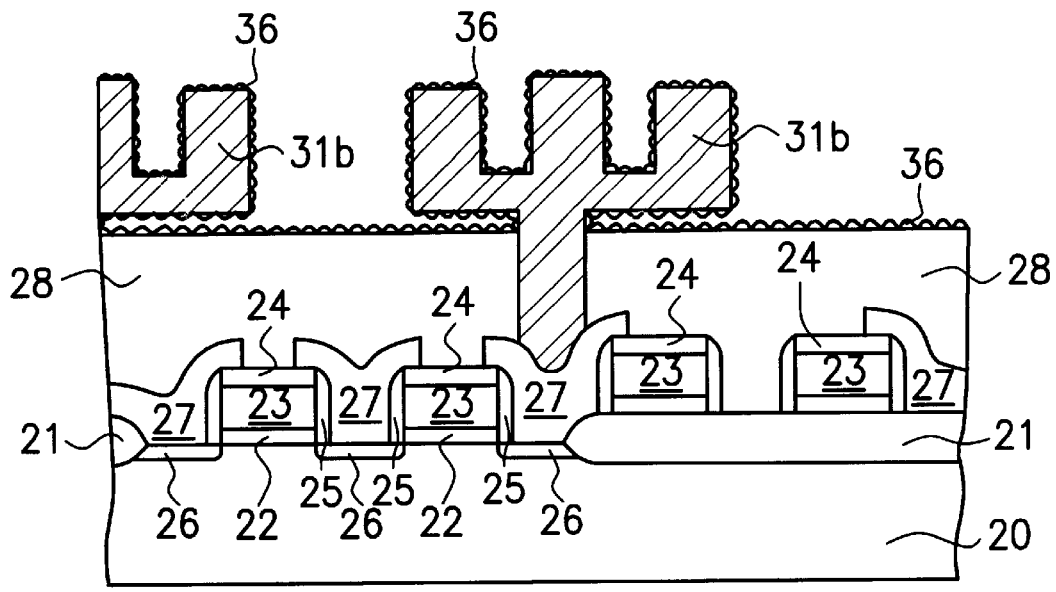
Figure 2H:
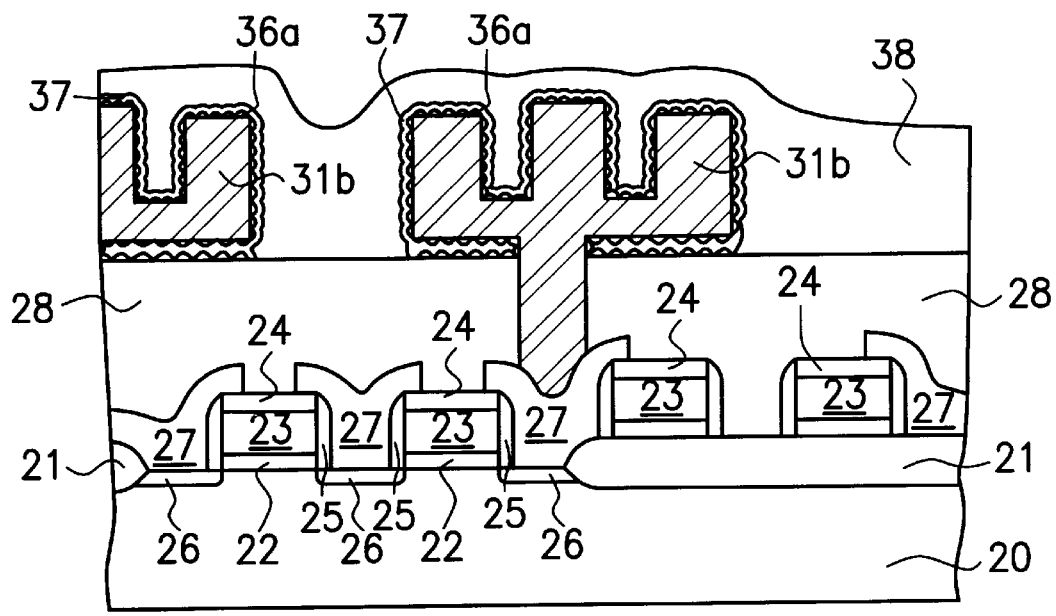

In the subsequent step, as shown in FIG. 2G, the silicon nitride layer 29 above the insulating layer 28 is removed using, for example, hot phosphoric acid solution in a wet etching operation. After the etching operation, the bottom portion of the dual trench structure 31b will be slightly separated from the insulating layer 28, thereby increasing the surface area of the lower electrode. Next, a hemispherical grained silicon layer 36 is formed over the first polysilicon layer, that is, the dual trench structure 31b, and the insulating layer 28.

Next, using the dual trench structure 31b as a mask, the hemispherical grained silicon layer 36 is patterned by etching. Because the surface of the dual trench structure 31b is not covered by an etching mask during the patterning operation, the hemispherical silicon grained layer 36 on the dual trench surface will be etched into a layer 36a having a hemispherical grained profile. The uneven hemispherical-grained profile on the dual trench surface serves to increase the surface area of the lower electrode further. Thereafter, a dielectric layer 37, for example, a silicon nitride/oxide (NO) composite layer or a tantalum pentoxide ($Ta_2O_5$) layer, is formed over the patterned layer 36a. Finally, an impurities-doped second polysilicon layer 38 is deposited over the dielectric layer 37 acting as an upper electrode of the capacitor.

During the operations of patterning the first oxide layer 32, forming silicon spacers 33 on the first oxide layer 33 and the subsequent etching the first polysilicon layer 31, if a plurality of trenches are formed in the first polysilicon layer 31 instead of just two trenches, the dual trench structure 31b will become a fork-shaped structure having several prongs.

In this embodiment, a self-aligned process is utilized to form a dual trench or a multiplicity of trenches, thus establishing a fork-shaped capacitor structure. There is no need for additional masking steps, and the uneven surface is able to increase the surface area of the lower electrode. Hence, a high capacitance capacitor is produced and a high level integration of DRAM cells can be realized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor on a semiconductor substrate, wherein one or more MOS transistors is formed on the substrate, with one source/drain terminal of a MOS transistor electrically coupled to a bit line, comprising the steps of:

forming an insulating layer and a silicon nitride layer over the substrate;

patterning the silicon nitride layer and the insulating layer to form a via exposing the bit line;

forming a first polysilicon layer and a first oxide layer over the silicon nitride layer, wherein the first polysilicon layer also completely fills the via;

patterning the first oxide layer, and then forming silicon nitride spacers on the sidewalls of the patterned first oxide layer covering a portion of the first polysilicon layer;

forming a second oxide layer on the exposed first polysilicon layer;

removing the silicon nitride spacers, and then using the first oxide layer and the second oxide layer as masks, etching the first polysilicon layer to form two trenches;

removing the first oxide layer and the second oxide layer;

patterning the first polysilicon layer to form a dual trench structure;

removing the silicon nitride layer to expose the insulating layer;

forming a hemispherical (rained silicon layer over the insulating layer and the dual trench structure;

patterning the hemispherical grained silicon layer using the dual trench structure as a mask, wherein the hemispherical grained silicon layer and the dual trench structure together constitutes a lower electrode of the capacitor after the patterning operation; and forming a dielectric layer and a second polysilicon layer over the lower electrode, wherein the second polysilicon layer acts as an upper electrode for the capacitor.

2. The method of claim 1, wherein the step of forming the first oxide layer includes a thermal oxidation method.

3. The method of claim 1, wherein the first oxide layer has a thickness of about 200 Å to 1000 Å.

4. The method of claim 1, wherein the step of forming the silicon nitride spacers includes the substeps of:

forming a silicon nitride layer over the patterned second oxide layer; and etching back the silicon nitride layer to form the silicon nitride spacers.

5. The method of claim 1, wherein the hemispherical grained silicon layer has a thickness of about 300 Å to 1000 Å.

6. The method of claim 1, wherein the step of removing the silicon nitride layer includes a wet etching method.

7. The method of claim 6, wherein the step of removing the silicon nitride layer includes using hot phosphoric acid solution.

8. The method of claim 1, wherein the step of patterning the hemispherical grained silicon layer includes a self-aligned etching operation.

9. The method of claim 1, wherein the step of forming the dielectric layer includes depositing nitride and oxide (NO) or tantalum oxide ($Ta_2O_5$).

10. A method for manufacturing a DRAM capacitor on a semiconductor substrate, wherein one or more MOS transistors is formed on the substrate, with one source/drain terminal of a MOS transistor electrically coupled to a bit line, comprising the steps of:

forming an insulating layer and a silicon nitride layer over the substrate;

patterning the silicon nitride layer and the insulating layer to form a via exposing the bit line;

forming a first polysilicon layer and a first oxide layer over the silicon nitride layer, wherein the first polysilicon layer also completely fills the via;

patterning the first oxide layer, and then forming silicon nitride spacers on the sidewalls of the patterned first oxide layer covering a portion of the first polysilicon layer;

forming a second oxide layer on the exposed first polysilicon layer;

removing the silicon nitride spacers, and then using the first oxide layer and the second oxide layer as masks, etching the first polysilicon layer to form a plurality of trenches;

removing the first oxide layer and the second oxide layer;

patterning the first polysilicon layer to form a fork-shaped structure having a plurality of trenches;

removing the silicon nitride layer to expose the insulating layer;

forming a hemispherical grained silicon layer over the insulating layer and the fork-shaped structure;

patterning the hemispherical grained silicon layer using the fork-shaped structure as a mask, wherein the hemispherical grained silicon layer and the fork-shaped structure together constitute a lower electrode of the capacitor after the patterning operation; and forming a dielectric layer and a second polysilicon layer over the lower electrode, wherein the second polysilicon layer acts as an upper electrode for the capacitor.

11. The method of claim 10, wherein the step of forming the first oxide layer includes a thermal oxidation method.

12. The method of claim 10, wherein the step of forming the silicon nitride spacers includes the substeps of:

forming a silicon nitride layer over the patterned second oxide layer; and etching back the silicon nitride layer to form the silicon nitride spacers.

13. The method of claim 10, wherein the step of removing the silicon nitride layer includes a wet etching method.

14. The method of claim 13, wherein the step of removing the silicon nitride layer includes using hot phosphoric acid solution.

15. The method of claim 10, wherein the step of patterning the hemispherical grained silicon layer includes a self-aligned etching operation.

16. The method of claim 10, wherein the step of forming the dielectric layer includes depositing nitride and oxide (NO) or tantalum oxide ($Ta_2O_5$).

* * * * *